(12) United States Patent
Lessmann

(10) Patent No.: US 12,156,361 B2
(45) Date of Patent: Nov. 26, 2024

(54) MODULAR INTERFACE SYSTEM FOR CONNECTING A CONTROL DEVICE AND FIELD DEVICES

(71) Applicant: Phoenix Contact GmbH & Co. KG, Blomberg (DE)

(72) Inventor: Gunnar Lessmann, Nieheim (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 807 days.

(21) Appl. No.: 17/066,388

(22) Filed: Oct. 8, 2020

(65) Prior Publication Data

US 2021/0144877 A1    May 13, 2021

(30) Foreign Application Priority Data

Oct. 9, 2019 (DE) .......................... 102019127195.9

(51) Int. Cl.
*G06F 13/20* (2006.01)
*H04L 12/40* (2006.01)
*H05K 7/14* (2006.01)

(52) U.S. Cl.
CPC ......... *H05K 7/1472* (2013.01); *H05K 7/1471* (2013.01); *H05K 7/1481* (2013.01)

(58) Field of Classification Search
CPC ............ H04L 2012/4026; H04L 12/40; H04L 12/4625; H04L 12/40189; H04L 12/40169; H04L 12/46; H04L 2012/40228; H04L 12/66; G06F 13/20; G06F 13/4063; G06F 2213/0058
USPC ................................... 710/100, 10, 313, 306
See application file for complete search history.

(56) References Cited

U.S. PATENT DOCUMENTS

| | | | |
|---|---|---|---|
| 4,658,333 | A | 4/1987 | Grimes |
| 5,128,855 | A | 7/1992 | Hilber et al. |
| 5,615,079 | A | 3/1997 | Eggert |
| 5,896,508 | A | 4/1999 | Lee |
| 6,033,268 | A | 3/2000 | Piper et al. |
| 6,241,561 | B1 | 6/2001 | Zebermann et al. |
| 6,640,308 | B1 | 10/2003 | Keyghobad et al. |
| 6,690,668 | B1 | 2/2004 | Szczepanek et al. |
| 6,728,239 | B1 | 4/2004 | Kung et al. |
| 6,947,410 | B1 | 9/2005 | Schwartz et al. |
| 7,286,552 | B1 | 10/2007 | Gupta et al. |

(Continued)

FOREIGN PATENT DOCUMENTS

| | | |
|---|---|---|
| CN | 1216475 C | 8/2005 |
| CN | 2805235 Y | 8/2006 |

(Continued)

OTHER PUBLICATIONS

Office Action issued in Chinese patent application No. 202080072299. 5, dated Apr. 29, 2023, 18 pp. w/ translation.

(Continued)

*Primary Examiner* — Kharye Pope
(74) *Attorney, Agent, or Firm* — Kaplan Breyer Schwarz, LLP

(57) ABSTRACT

A modular interface system having a modular SPE-based bus system with an SPE-based twin-core line and a plurality of SPE-based connectors, wherein a plurality of modules, each of which has an SPE-based connector, can be electrically and mechanically coupled to the SPE-based bus system by means of the SPE-based connectors.

16 Claims, 6 Drawing Sheets

(56) References Cited

U.S. PATENT DOCUMENTS

| | | | |
|---|---|---|---|
| 7,359,371 B2 | 4/2008 | Emley et al. | |
| 7,408,876 B1 | 8/2008 | Gupta et al. | |
| 7,599,292 B1 | 10/2009 | Gupta et al. | |
| 7,719,992 B1 | 5/2010 | Gourlay et al. | |
| 8,204,070 B1 | 6/2012 | Ghaibeh | |
| 8,654,680 B2 | 2/2014 | Subramanian et al. | |
| 8,711,681 B2 | 4/2014 | Hu et al. | |
| 8,758,061 B2 | 6/2014 | Mische et al. | |
| 8,799,551 B2 | 8/2014 | Ham | |
| 8,867,552 B2 | 10/2014 | Vobbilisetty et al. | |
| 8,958,414 B1 | 2/2015 | Wong | |
| 9,225,556 B2 | 12/2015 | Chini et al. | |
| 10,186,821 B2 | 1/2019 | Müller et al. | |
| 10,313,103 B1 | 6/2019 | Perras et al. | |
| 2002/0065935 A1 | 5/2002 | Koperda et al. | |
| 2003/0021080 A1 | 1/2003 | Koperda et al. | |
| 2003/0174719 A1 | 9/2003 | Sampath et al. | |
| 2004/0033720 A1 | 2/2004 | Bergner et al. | |
| 2004/0085894 A1 | 5/2004 | Wang et al. | |
| 2004/0105425 A1 | 6/2004 | Chen et al. | |
| 2004/0131073 A1 | 7/2004 | Hahn et al. | |
| 2004/0158667 A1 | 8/2004 | Carr | |
| 2004/0240180 A1 | 12/2004 | Crippen et al. | |
| 2005/0044137 A1 | 2/2005 | Dubreuil | |
| 2005/0078706 A1 | 4/2005 | Spencer | |
| 2005/0135387 A1 | 6/2005 | Rychener et al. | |
| 2005/0228889 A1 | 10/2005 | Cohen et al. | |
| 2007/0060362 A1 | 3/2007 | Osgood et al. | |
| 2008/0123635 A1 | 5/2008 | Mortensen et al. | |
| 2008/0205418 A1 | 8/2008 | Rose et al. | |
| 2011/0243152 A1 | 10/2011 | Goncalves et al. | |
| 2011/0292206 A1 | 12/2011 | Newton | |
| 2012/0026648 A1 | 2/2012 | Schneider et al. | |
| 2012/0290759 A1 | 11/2012 | Blair et al. | |
| 2012/0294156 A1 | 11/2012 | Hack et al. | |
| 2013/0045613 A1 | 2/2013 | Griese et al. | |
| 2013/0100884 A1 | 4/2013 | King et al. | |
| 2013/0301495 A1 | 11/2013 | Miller | |
| 2015/0023368 A1 | 1/2015 | Connolly et al. | |
| 2015/0043576 A1 | 2/2015 | Dixon et al. | |
| 2015/0120001 A1 | 4/2015 | German et al. | |
| 2015/0121507 A1* | 4/2015 | Haija | G06F 21/44 726/17 |
| 2015/0188798 A1 | 7/2015 | Mizrahi et al. | |
| 2015/0263762 A1 | 9/2015 | Shen et al. | |
| 2015/0333637 A1 | 11/2015 | Izumi | |
| 2016/0037240 A1 | 2/2016 | Yang et al. | |
| 2016/0173021 A1 | 6/2016 | Lelkes | |
| 2016/0173371 A1 | 6/2016 | Bays | |
| 2016/0191418 A1 | 6/2016 | Kong | |
| 2017/0070365 A1 | 3/2017 | Varmani | |
| 2017/0244635 A1 | 8/2017 | Felemban et al. | |
| 2018/0069359 A1 | 3/2018 | Müller et al. | |
| 2018/0139062 A1 | 5/2018 | Alley et al. | |
| 2018/0281598 A1 | 10/2018 | Shu | |
| 2019/0238349 A1 | 8/2019 | Moffitt et al. | |
| 2019/0319394 A1 | 10/2019 | Trenkamp et al. | |
| 2020/0078070 A1 | 3/2020 | Henderson et al. | |
| 2020/0127869 A1* | 4/2020 | Spanjers | H04L 12/40176 |
| 2020/0153174 A1* | 5/2020 | Curtis | H01R 13/6272 |
| 2020/0195022 A1* | 6/2020 | Bains | G06F 13/1668 |
| 2020/0221544 A1 | 7/2020 | Nishizaki et al. | |
| 2020/0235780 A1* | 7/2020 | Bains | H04B 3/23 |
| 2020/0394146 A1* | 12/2020 | McLaughlin | G05B 19/058 |
| 2020/0408565 A1 | 12/2020 | Lee et al. | |
| 2021/0235594 A1 | 7/2021 | Teeter et al. | |
| 2022/0046114 A1 | 2/2022 | Entelis et al. | |
| 2022/0209987 A1 | 6/2022 | Müller | |

FOREIGN PATENT DOCUMENTS

| | | |
|---|---|---|
| CN | 102099783 A | 6/2011 |
| CN | 102833112 A | 12/2012 |
| CN | 103164380 A | 6/2013 |
| CN | 104243297 A | 12/2014 |
| CN | 204578558 U | 8/2015 |
| CN | 204721371 U | 10/2015 |
| CN | 105099820 A | 11/2015 |
| CN | 105453492 | 3/2016 |
| CN | 105703690 A | 6/2016 |
| CN | 206364825 U | 7/2017 |
| CN | 207601619 U | 7/2018 |
| CN | 207926649 U | 9/2018 |
| DE | 3688778 T2 | 3/1994 |
| DE | 4421267 A1 | 1/1996 |
| DE | 4438804 C1 | 3/1996 |
| DE | 19600644 C1 | 4/1997 |
| DE | 19651961 A1 | 6/1998 |
| DE | 19706636 A1 | 8/1998 |
| DE | 29706564 U1 | 8/1998 |
| DE | 29901194 U1 | 5/1999 |
| DE | 19807710 A1 | 9/1999 |
| DE | 19902745 A1 | 8/2000 |
| DE | 20015758 U1 | 1/2002 |
| DE | 10148470 A1 | 4/2003 |
| DE | 10204694 A1 | 7/2003 |
| DE | 10216115 A1 | 10/2003 |
| DE | 10316649 A1 | 11/2003 |
| DE | 20217772 U1 | 3/2004 |
| DE | 10245643 A1 | 4/2004 |
| DE | 10254285 A1 | 6/2004 |
| DE | 10360190 A1 | 7/2004 |
| DE | 102004056363 A1 | 6/2006 |
| DE | 102005010820 A1 | 9/2006 |
| DE | 60123984 T2 | 6/2007 |
| DE | 102007009552 A1 | 8/2008 |
| DE | 60133747 T2 | 7/2009 |
| DE | 102009001177 A1 | 9/2010 |
| DE | 102009003846 A1 | 11/2010 |
| DE | 202011000834 U1 | 11/2011 |
| DE | 202011000835 U1 | 11/2011 |
| DE | 202011105337 U1 | 11/2011 |
| DE | 102011051154 A1 | 2/2012 |
| DE | 102011006590 A1 | 5/2012 |
| DE | 102013003971 A1 | 9/2014 |
| DE | 102013206723 A1 | 10/2014 |
| DE | 102015200568 A1 | 7/2015 |
| DE | 102014004241 A1 | 10/2015 |
| DE | 102014110017 A1 | 1/2016 |
| DE | 102014111030 A1 | 2/2016 |
| DE | 102014115678 A1 | 4/2016 |
| DE | 102015223315 A1 | 5/2016 |
| DE | 102014119065 A1 | 6/2016 |
| DE | 102014119101 A1 | 6/2016 |
| DE | 102016110641 B3 | 11/2017 |
| DE | 102016215742 A1 | 3/2018 |
| DE | 102016223024 A1 | 5/2018 |
| DE | 102016124637 A1 | 6/2018 |
| DE | 102017212256 A1 | 1/2019 |
| DE | 102017212487 A1 | 1/2019 |
| EP | 0345493 A1 | 12/1989 |
| EP | 0364618 A1 | 4/1990 |
| EP | 0710064 A1 | 5/1996 |
| EP | 0776077 A2 | 5/1997 |
| EP | 1126665 A2 | 8/2001 |
| EP | 1203303 A1 | 5/2002 |
| EP | 1282287 A2 | 2/2003 |
| EP | 1547314 A1 | 6/2005 |
| EP | 1576765 A1 | 9/2005 |
| EP | 1800450 A1 | 6/2007 |
| EP | 1884148 A2 | 2/2008 |
| EP | 1983812 A1 | 10/2008 |
| EP | 2002348 A2 | 12/2008 |
| EP | 2161638 A1 | 3/2010 |
| EP | 2187571 A1 | 5/2010 |
| EP | 2211523 A1 | 7/2010 |
| EP | 2241980 A1 | 10/2010 |
| EP | 2282321 A1 | 2/2011 |
| EP | 2405612 A1 | 1/2012 |
| EP | 2421100 A1 | 2/2012 |
| EP | 2448182 A1 | 5/2012 |
| EP | 2456133 A1 | 5/2012 |
| EP | 2631810 A1 | 8/2013 |

(56) References Cited

FOREIGN PATENT DOCUMENTS

| | | |
|---|---|---|
| EP | 2648284 A1 | 10/2013 |
| EP | 2698677 A1 | 2/2014 |
| EP | 2765465 A1 | 8/2014 |
| EP | 2913727 A1 | 9/2015 |
| EP | 3032732 A2 | 6/2016 |
| EP | 3040794 A1 | 7/2016 |
| EP | 3090511 A1 | 11/2016 |
| EP | 3179689 A1 | 6/2017 |
| EP | 3192704 A1 | 7/2017 |
| EP | 3256983 A1 | 12/2017 |
| EP | 3324579 A1 | 5/2018 |
| EP | 3373527 A1 | 12/2018 |
| GB | 2404815 A | 2/2005 |
| JP | 03-016383 U | 2/1991 |
| JP | 2004-227570 | 8/2004 |
| JP | 2006-314098 | 11/2006 |
| JP | 2008-078906 | 4/2008 |
| JP | 2008-547294 | 12/2008 |
| JP | 2009-211838 A | 9/2009 |
| JP | 2011-049659 A | 3/2011 |
| JP | 2011-185612 A | 9/2011 |
| JP | 5040246 B2 | 10/2012 |
| JP | 2015-530046 | 10/2015 |
| JP | 2016-081391 | 5/2016 |
| JP | 2018-073418 | 5/2018 |
| JP | 2018-514904 | 6/2018 |
| KR | 10-0404092 B1 | 11/2003 |
| WO | 94/27196 A1 | 11/1994 |
| WO | 97/41650 A1 | 11/1997 |
| WO | 99/23737 A1 | 5/1999 |
| WO | 00/64099 A2 | 10/2000 |
| WO | 01/09739 A1 | 2/2001 |
| WO | 02/27465 A1 | 4/2002 |
| WO | 2003/107594 A1 | 12/2003 |
| WO | 2004/054174 A1 | 6/2004 |
| WO | 2006/039941 A1 | 4/2006 |
| WO | 2006/124515 A2 | 11/2006 |
| WO | 2007/121022 A2 | 10/2007 |
| WO | 2008097992 A1 | 8/2008 |
| WO | 2012/000807 A1 | 1/2012 |
| WO | 2012/000808 A1 | 1/2012 |
| WO | 2015/103469 A1 | 7/2015 |
| WO | 2015/198087 A1 | 12/2015 |
| WO | 2016/094825 A1 | 6/2016 |
| WO | 2016/128668 A1 | 8/2016 |
| WO | 2016/151019 A1 | 9/2016 |
| WO | 2017/037381 A1 | 3/2017 |
| WO | 201849314 A1 | 3/2018 |
| WO | 2018068040 A1 | 4/2018 |
| WO | 2018104929 A1 | 6/2018 |
| WO | 201943446 A1 | 3/2019 |

OTHER PUBLICATIONS

Office Action issued in Japanese Patent Application No. 2021-560962 dated Apr. 12, 2023 and English Translation thereof.
Office Action issued in Chinese patent application No. 202011072393.9, dated Jun. 29, 2022, 19 pp. w/ translation.
"Ethernet over twisted pair", Wikipedia, the free encyclopaedia, 4 pp., https://en.wikipedia.org/wiki/OI-Link, Feb. 13, 2019.
"IO-Link", Wikipedia, the free encyclopaedia, 7 pp. w/ translation, https://en.wikipedia.org/wiki/OI-Link, Feb. 13, 2019.
ABB Research Ltd, English Translation of Indian patent application No. 932/CHE/2008 filed on Apr. 16, 2008 entitled "An Intelligent Electronic Device for Substation or Distribution Automation Systems" (published application was not available), Jul. 2, 2010, 7 pp.
Authorized Officer: Bielert, Erwin, International Search Report issued in PCT application No. PCT/EP2021/057014, dated Jun. 17, 2021, 3 pp.
Authorized Officer: Mircescu, Alexander, International Search Report issued in PCT application No. PCT/EP2020/061230, dated Jul. 2, 2020, 3 pp.
Authorized Officer: Nora Lindner, English Translation of the International Preliminary Report on Patentability issued in PCT application No. PCT/EP2020/078742, ated Apr. 19, 2022, 10 pp.
Authorized Officer: Nora Lindner, English translation of the International Preliminary Report on Patentability issued in PCT application No. PCT/EP2020/061230, dated Sep. 28, 2021, 7 pp.
Authorized Officer: Weinmiller, Jost, International Search Report issued in PCT application No. PCT/EP2020/078742, dated Jan. 13, 2021, 2 pp.
English Translation of International Preliminary Report on Patentability dated Sep. 22, 2022 in PCT Patent Application No. PCT/EP2021/057014.
Office Action issued in German patent application No. 102019110592.7, dated Feb. 13, 2020, 15 pp. w/ translation.
Office Action issued in German patent application No. 102019127551.2, dated Aug. 25, 2020, 17 pp. w/ translation.
Office Action issued in Chinese patent application No. 2020800306862, dated Aug. 26, 2022, 14 pp. w/ translation.
Search Report issued in Belgian patent application No. BE2019/5271, dated Oct. 16, 2019, 10 pp.
Inventor: Martin Muller, Multifunctional Network Switch for Use in a Process-Controlling Automation System . . . , Apr. 12, 2022, Unpublished Related U.S. Appl. No. 17/768,342.
Inventor: Martin Müller et al., Unpublished U.S. Appl. No. 17/914,679 entitled : Backplane Module for Electrically Connecting a Plurality of Functional Modules . . . :, filed Sep. 26, 2022.
Non-Final Office Action dated Dec. 8, 2022 for U.S. Appl. No. 17/605,401.
Office Action dated Nov. 30, 2022 in Japanese Patent Application No. 2021-560962 and English Translation thereof.
Office Action issued in corresponding German patent application No. 102019127195.9, dated Jun. 3, 2020, 26 pp.
Wikipedia, "Ethernet over twisted pair", Mar. 25, 2019, 4 pp.
Office Action issued in Chinese patent application No. 202011072393.9, dated Dec. 2, 2021, 21 pp. w/ translation.
Non-Final Rejection dated Jul. 3, 2023 for U.S. Appl. No. 17/605,401, 10 page(s).
Wikipedia, IO-Link definition, Feb. 5, 2019, 7 pp., https://de.wikipedia.org/w/index.php?title=IO-Link&oldid=185391430. English Translation: https://en.wikipedia.org/wiki/IO-Link.
Authorized Officer: Martinez Orta, Maxima, "International Search Report and Written Opinion" issued in counterpart PCT application No. PCT/EP2016/056385, dated Jul. 5, 2016.
Matthias Mueller, "Office Action" issued in counterpart German patent application No. 102015104290.8, dated Jan. 18, 2016.
Notice of Allowance and Fees Due (PTOL-85) received for U.S. Appl. No. 15/560,016, dated Nov. 15, 2018, 2 pages.
Notice of Allowance received for U.S. Appl. No. 15/560,016, dated Oct. 1, 2018, 2 pages.
Notice of Allowance received for U.S. Appl. No. 15/560,016, dated Sep. 12, 2018, 5 pages.
Office Action issued in Japanese Patent Application No. 2022-521077 dated Nov. 22, 2023 and English Translation thereof.
Office Action dated Nov. 22, 2023 in Japanese Patent Application No. 2022-554821 and English Translation thereof.
Office Action issued in Japanese patent application No. 2017-549774, dated Sep. 28, 2018, 9 pp.
Final Rejection Mailed on Jan. 12, 2024 for U.S. Appl. No. 17/605,401, 13 page(s).
Non-Final Rejection Mailed on Mar. 27, 2024 for U.S. Appl. No. 17/768,342, 11 page(s).
Non-Final Rejection Mailed on May 21, 2024 for U.S. Appl. No. 17/605,401, 11 page(s).
Office Action issued in Japanese Patent Application No. 2022-554821 on Apr. 10, 2024 and English Translation thereof.
Notice of Allowance and Fees Due (PTOL-85) Mailed on Jul. 17, 2024 for U.S. Appl. No. 17/914,679, 8 page(s).
List of references Mailed on Jul. 17, 2024 for U.S. Appl. No. 17/914,679, 1 page(s).

* cited by examiner

MODULAR INTERFACE SYSTEM FOR CONNECTING A CONTROL DEVICE AND FIELD DEVICES

CROSS-REFERENCE TO RELATED APPLICATIONS

This application claims priority to German Patent Application No. 10 2019 127 195.9, filed Oct. 9, 2019. The entire disclosure of German Patent Application No. 10 2019 127 195.9 is incorporated herein by reference.

FIELD

The invention relates to a modular interface system for connecting at least one control device, and also field devices, in particular actuators and/or sensors, wherein the modular interface system can be used in an industrial automation or building automation environment.

BACKGROUND

Modular interface systems form the interface between a control device, such as a programmable logic control device (PLC), and sensors and actuators installed in a field. Up to now, sensors and actuators communicate with the control device via manufacturer-specific backplane buses of modular interface systems. An example of a known modular interface system is, for example, the AXIOLINE F or the interface system (IFS) of the applicant.

Modular interface systems with a manufacturer-specific backplane bus system have the disadvantage that it is not possible to use standard chips to connect sensors and actuators to the proprietary backplane bus systems; also, the communication protocols used are manufacturer-specific.

SUMMARY

The invention is based on the object of creating a modular interface system for connecting a control device and field devices, in particular actuators and/or sensors, which avoids the disadvantages of conventional modular interface systems based on proprietary backplane buses and which can be expanded inexpensively and in a simple manner. A core idea of the invention can be considered to be the provision of a modular interface system which has a modular SPE-based bus system with an SPE-based twin-core line and a plurality of SPE-based connectors, wherein, by means of the SPE-based connectors, a plurality of modules, each having an SPE-based connector, can be electrically and mechanically coupled to the SPE-based bus system. The abbreviation SPE stands for Single Pair Ethernet.

The above-mentioned technical problem is solved by the features of claim 1.

Accordingly, a modular interface system for connecting a control device and field devices is provided, having the following features:

a modular SPE-based bus system which has an SPE-based twin-core line and a plurality of first SPE-based connectors which are electrically connected to the SPE-based twin-core line, a first module which has a second SPE-based connector and a first interface, wherein the second SPE-based connector is designed for electrical and mechanical coupling with one of the plurality of first SPE-based connectors of the SPE-based bus system, and the first interface is designed for electrically connecting a control device, wherein the first module is designed to enable the communication of a control device which can be connected to the first interface via the SPE-based bus system, according to a first communication protocol, and also—at least one second module, which has a third SPE-based connector which is designed for electrical and mechanical coupling with another of the plurality of first SPE-based connectors of the SPE-based bus system, and which has at least one second interface which is designed for connecting a field device, wherein the second module is designed to enable the communication of a field device which can be connected to the at least one second interface via the SPE-based bus system, according to the first communication protocol, and/or a third module, which has a fourth SPE-based connector which is designed for electrical and mechanical coupling with one of the plurality of first SPE-based connectors of the SPE-based bus system, at least one third and fourth interface, which are each designed for the connection of a field device, and which has a switch which has a first port assigned to the fourth SPE-based connector, a second port assigned to the third interface, and a third port assigned to the fourth interface, wherein the second port and the third interface are based on SPE technology or on a first Ethernet technology that is not SPE technology, the third port and the fourth interface are based on SPE technology or on a second Ethernet technology that is not SPE technology, wherein the first and second Ethernet technology are the same or different, wherein the third module is designed to enable the communication of a field device which can be connected to the third interface, and the communication of a field device which can be connected to the fourth interface, via the SPE-based bus system, according to the first communication protocol.

It should be noted at this point that the first module can function as a head station, while the at least one second module and/or the third module can be designed as a connection module(s)—that is, an IO module for connecting field devices such as sensors and actuators. The first communication protocol is preferably an Ethernet-based communication protocol, such as PROFINET.

Advantageous developments are the subject of the dependent claims.

BRIEF DESCRIPTION OF THE DRAWINGS

The invention is explained in more detail below with reference to a few exemplary embodiments in conjunction with the accompanying drawings, in which.

DETAILED DESCRIPTION

Figure 1:
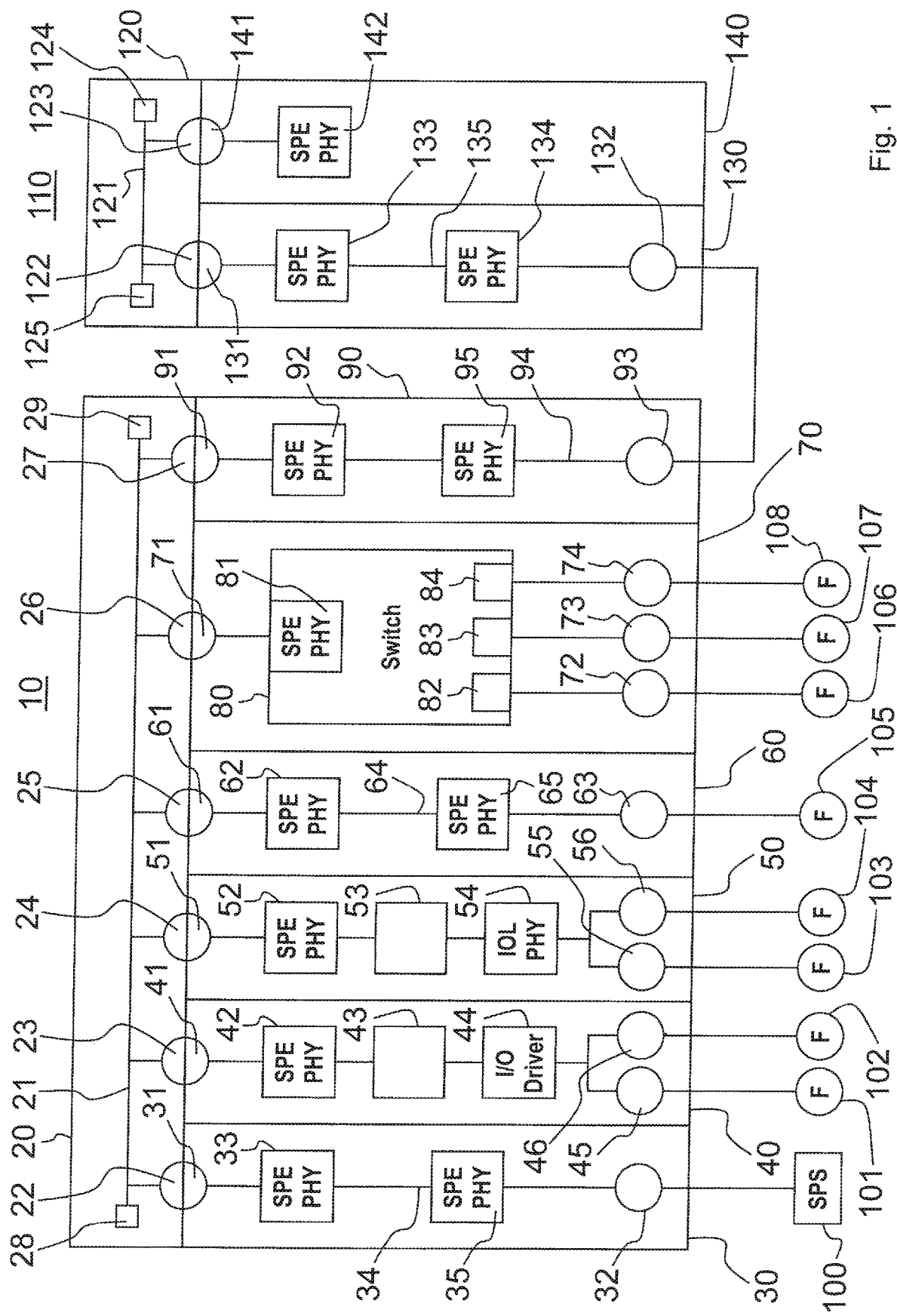
FIG. 1 is an exemplary modular interface system according to the invention, which can be expanded by a second modular interface system according to the invention.

FIG. 1 shows an exemplary modular interface system 10, which is designed, by way of example, to connect a control device 100 and a plurality of field devices 101-108. It should be mentioned at this point that the field device 101 can be an analog or digital sensor, while the field device 102 can be an analog or digital actuator. An analog or digital sensor is a field device that has an analog or digital output. An analog or digital actuator is understood to be an actuator that has an analog or digital input. The field device 103 can be an IOL-based sensor, while the field device 104 can be an IOL-based actuator. In other words: The field devices 103 and 104 each have an IOL interface. IOL is an acronym for IO-Link. The field devices 105-107 can be field devices with an SPE-based interface. Field device 108 can be a field device with an interface that can be configured according to conventional 4-wire or 8-wire Ethernet technology. It should be noted once again that the abbreviation SPE stands for Single Pair Ethernet, which is known per se.

The modular interface system 10 has a modular SPE-based bus system 20 with an SPE-based twin-core line 21, which is terminated at both ends by means of a terminating resistor 28 or 29, and with a plurality of SPE-based connectors 22-26 which are electrically connected to the SPE-based twin-core line 21. Up to six modules can thus be connected to the bus system 20 of the modular interface system 10 shown by way of example in FIG. 1. Of course, the modular interface system 10 can also be designed for more than six modules. It should be noted at this point that the term "modular" is to be understood to mean an SPE-based bus system 20 which is designed as a compact module, as shown in FIG. 1, or which can be composed of a plurality of individual modular bus system segments. In this case, the SPE-based bus system can have three individual modular bus segments, wherein each bus segment, for example, contains two SPE-based connectors.

A first module 30, shown in FIG. 1, has an SPE-based connector 31 and a first interface 32. The interface 32 of the first module 30 can be designed as an SPE-based interface via which, for example, the SPE-based control device 100 can be connected to the first module 30. The SPE-based connector 31 of the first module 30 is designed for electrical and mechanical coupling with one of the plurality of SPE-based connectors 22-26 of the SPE-based bus system. In the present example, the first module 30 is coupled to the SPE-based bus system 20 via the SPE-based connector 22. Between the SPE-based connector 31 and the SPE-based interface 32, two SPE-based line drivers 33 and 35, wired opposite each other, are preferably connected into an SPE-based twin-core line 34, which connects the SPE-based connector 31 and the SPE-based interface. The two SPE-based line drivers 33 and 35, also designated by SPE PHY in FIG. 1, ensure that the SPE-based bus system 20 and the externally connectable control device 100 are decoupled. It should also be noted that the SPE-based connector 31 and the SPE-based connector 22 of the bus system 20 are designed as complementary connectors. In a similar manner, the SPE-based interface 32 of the first module 30 can also be designed as an SPE-based plug or SPE-based socket.

One task of the first module 30 can be seen as enabling the communication of the SPE-based control device 100 connected to the SPE-based interface 32 via the SPE-based bus system 20, according to a first communication protocol. The first communication protocol is expediently an Ethernet-based communication protocol, which can be PROFINET, for example.

It should also be noted that the module 30, like the modules described further below, can be designed as a connection terminal.

A further module 40 can be coupled to the SPE-based bus system 20. The module is designed in particular as an IO connection module. For this purpose, the module 40 has an SPE-based connector 41, which in the example shown can be electrically and mechanically coupled to the SPE-based connector 23 of the SPE-based bus system 20. Furthermore, the module 40 can have at least one interface 45 which is designed for connecting a field device. In the illustrated embodiment, a further interface 46 is provided which is also designed for connecting a field device. The two interfaces 45 and 46 can be analog interfaces to which the analog field device 101 and/or the analog field device 102 can be connected. Alternatively, the two interfaces 45 and 46 can also be designed as digital input and/or output connections to which a digital field device and/or a digital field device can then be connected.

In particular, the module 40 has the task of enabling data transmission from a field device which can be connected to the at least one interface 45, via the SPE-based bus system 20, according to the first communication protocol.

For the following explanations, it is now assumed that the interface 45 functioning as the input interface, and the interface 46 of the module 40, functioning as the output interface, are designed as analog interfaces. The corresponding analog signals are expediently amplified in a manner known per se, via an I/O line driver 44. In order to enable communication between the analog interfaces 45 and 46 and the SPE-based connector 41, an adapter device 43 is implemented in the connection module 40, which on the one hand performs a physical adaptation of the analog interfaces 45 and 46 to the SPE-based connector 41, and on the other hand carries out a protocol conversion between the first communication protocol and a second communication protocol, and vice versa, wherein the second communication protocol is used by the field devices 101 and 102 connected to the interfaces 45 and 46. The second communication protocol can be MODBUS/TCP. An SPE-based line driver 42 can expediently be implemented between the SPE-based connector 41 and the adapter device 43.

Alternatively or additionally, an IO connection module 50 can be electrically and mechanically coupled to the SPE-based bus system 20. By way of example, the module 50 is an IO-Link module which has at least one IOL-based interface—in the present example, it has two IOL-based interfaces 55 and 56. For example, an IOL-based sensor can be connected to the IOL-based interface 55, and an IOL-based actuator 104 can be connected to the IOL-based interface 56. An adapter device 53 can also be implemented in the IO-Link module 50, performing a physical adaptation of the IOL-based interfaces 55 and 56 to the SPE-based connector 51, which is coupled, for example, to the SPE-based connector 24 of the bus system 20. In addition, the adapter device 53 ensures that data according to the IOL communication protocol are converted into the first communication protocol, and/or vice versa. Expediently, an SPE-based line driver 52 is also implemented between the adapter device 53 and the SPE-based connector 51.

Alternatively or additionally, a further IO connection module 60, which has an SPE-based connector 61, can be electrically and mechanically coupled to the interface system 10, for example via the SPE-based connector 25 of the bus system 20. Similar to module 30, module 60 can have an SPE-based interface 63 to which the SPE-based field device 105 can be connected. The SPE-based connector 61 and the SPE-based interface 63 are electrically connected via an SPE-based twin-core line 64. Between the SPE-based connector 61 and the SPE-based interface 63, two SPE-based line drivers 62 and 65, wired opposite each other, are preferably connected into the SPE-based twin-core line 64. The two SPE-based line drivers 62 and 35, also designated by SPE PHY in FIG. 1, ensure that the SPE-based bus system 20 and the externally connectable field device 105 are decoupled.

Alternatively or additionally, a further IO connection module 70 can be electrically and mechanically coupled to the SPE-based bus system 20. For this purpose, the module 70 has an SPE-based connector 71, which is electrically and mechanically coupled, for example, to the SPE-based connector 26 of the bus system 20. The connection module 70 can have a plurality of interfaces, each of which is designed for the connection of a field device. In the present example, the module 70 has three connections 72-74 to which, for example, the field device 106, the field device 107, and/or the field device 108 can be connected. It is assumed that the interfaces 72 and 73 are each designed as an SPE-based interface, while the interface 74 can be designed according to conventional 4- or 8-wire Ethernet technology. The module 70 has a switch 80 which has an SPE-based port 81, which can additionally be designed as an SPE-based line driver. The port 81 is electrically connected to the SPE-based connector 71. The switch 80 also has three further ports 82-84. The ports 82 and 83 are each based on SPE technology and are electrically connected to the SPE-based interface 72 and/or the SPE-based interface 73, respectively. The further port 84 is designed to correspond to the interface 74, according to conventional 4- or 8-wire Ethernet technology. It should be noted that the switch 80 is preferably designed as an Ethernet layer 2 switch, which only forwards data messages and does not convert the protocol. The switch 80 only needs to physically adapt the port 74 to the port 81. From a functional point of view, the switch 80 substantially corresponds to an Ethernet switch.

In order to be able to expand the modular interface system 10 in a flexible, modular manner, a further module 90 can be electrically and mechanically coupled to the SPE-based bus system 20. The module 90 can be constructed similarly to the modules 30 60. The module 90 can have an SPE-based connector 91, which can be electrically and mechanically coupled, for example, to the SPE-based connector 27 of the bus system 20. Furthermore, the module 30 has an SPE-based interface 93 to which, for example, an SPE-based twin-core line 150 is connectable, to which a further modular interface system 110 can in turn be connected. Similarly to the module 60, two SPE-based line drivers 92 and 95 wired opposite each other can be connected into an SPE-based twin-core line 94 between the SPE-based connector 91 and the SPE-based interface 93. The two SPE-based line drivers 92 and 95, also designated by SPE PHY in FIG. 1, ensure that the SPE-based bus system 20 and the additional externally connectable modular interface system 110 are decoupled.

The additional modular interface system 110 can be constructed in a substantially similar manner to the interface system 10. For the sake of simple illustration, only one module 130 is shown schematically, which has an SPE-based connector 131 and an SPE-based interface 132, which can be connected to the SPE-based twin-core line 150. Between the SPE-based connector 131 and the SPE-based interface 132, two SPE-based line drivers 133 and 134 which are wired opposite each other can be connected into an SPE-based twin-core line 135. The interface system 110 likewise has a modular bus system 120, which has an SPE-based twin-core line 121 and, for example, two SPE-based connectors 122 and 123. The SPE-based twin-core line 121 is terminated at both ends with a terminating resistor 124 and/or 125. A module 140, shown only schematically, is connected to the SPE-based connector 123 of the second interface system 110 via an SPE-based connector 141. The two SPE-based line drivers 133 and 134 ensure that the two interface systems 10 and 110 are decoupled.

The modular interface system 10 shown by way of example in FIG. 1 can be easily expanded in a modular manner. In addition, the modular interface system 10 enables the modules to be removed and inserted during ongoing operation without this affecting neighboring modules. Another advantage of the modular interface system 110 can be seen in the fact that old and new technologies, such as conventional IOL technologies and analog and digital connection modules, can be used jointly in a simple manner.

It should also be noted that the SPE-based bus system 20 can be designed for installation on a mounting rail (not shown). In addition, the modular interface system 10 allows a compact design, since the modules, as shown in FIG. 1, can be coupled to the modular SPE-based bus system 20 next to one another and side-by-side.

Figure 2:
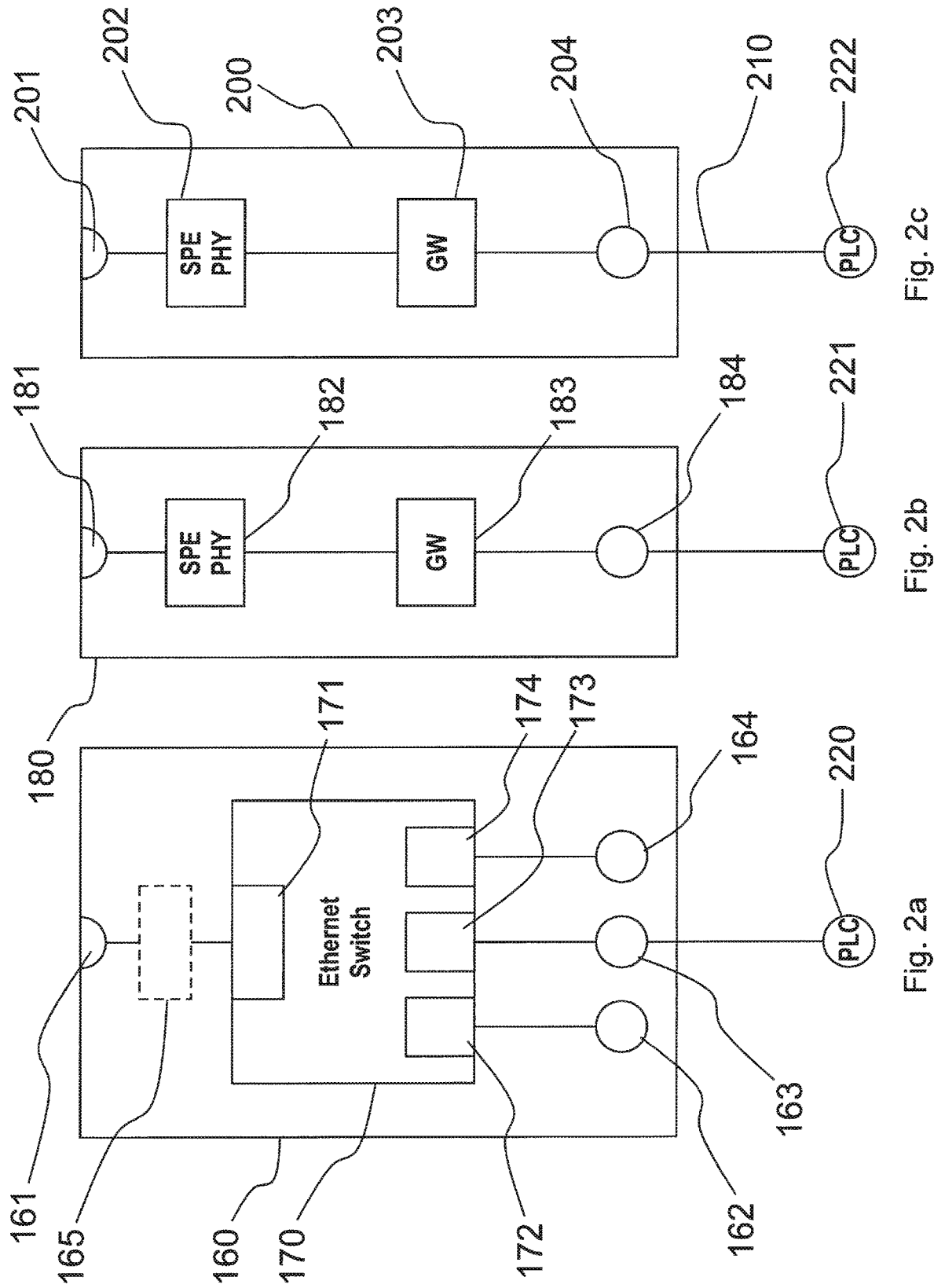
FIGS. 2a-2c are exemplary embodiments of the first module shown in FIG. 1, which can function as a head station.

Instead of the module 30 shown in FIG. 1 as the head station, a module 170 shown in FIG. 2a, a module 180 shown in FIG. 2b or a module 200 shown in FIG. 2c can also be used.

The module 160 shown in FIG. 2a has an SPE-based connector 161, which can be electrically and mechanically coupled to the SPE-based connector 22 of the bus system 20, for example. Furthermore, the module 160 has at least two, for example three, Ethernet-based interfaces 162-164, wherein the interface 163 is provided for the connection of a control device 220, for example, while a field device (not shown) can be connected to the interfaces 162 and 164. For example, the interface 162 is designed as an SPE-based interface, while the other two interfaces 163 and 164 can be designed according to conventional 4-wire or 8-wire Ethernet technology. Furthermore, the module 160 has a switch 170 which has an SPE-based port 171 which is electrically connected to the SPE-based connector 161. The SPE-based port 171 can also have an SPE-based line driver. Furthermore, the switch 170 has at least two, and in the present example three, further ports 172-174, the port 172 being designed as an SPE-based port that is electrically connected to the SPE-based interface 162. The port 173 and the port 174 are designed according to conventional 4-wire or 8-wire Ethernet technology, like the interface 163 or the interface 164, and are each electrically connected to the interfaces 163 and/or 164, respectively, assigned to them. The switch 170 is used to enable a star, line or ring topology. Furthermore, the switch is designed to physically adapt the two interfaces 173 and 174, which are designed according to conventional 4- or 8-wire Ethernet technology, to the SPE-based port 171.

In the module 160 explained above, it is assumed, for example, that the control device 220 uses the first communication protocol, which is also to be used for communication via the bus system 20. As a result, no gateway functionality is required in the module 160. However, if the control device 220 uses a second communication protocol that differs from the first communication protocol, a gateway 165 must preferably be connected between the SPE-based connector 161 and the SPE-based port 171 of the switch, which gateway 165 converts the first communication protocol into the second communication protocol, and vice-versa.

The module 180 shown in FIG. 2b, which can function as a head station, in turn has an SPE-based connector 181, which can be connected, for example, to the SPE-based complementary connector 22 of the bus system 20.

Furthermore, the module 180 has at least one interface 184, which can be designed in accordance with conventional 4-wire or 8-wire Ethernet technology. A control device 221, which can have a conventional 4-wire or 8-wire Ethernet-based interface, can be connected to the network point 184. It is assumed in this case that the control device 221 uses a second communication protocol that differs from the first communication protocol. For example, the second communication protocol is the MODBUS/TCP communication protocol. Accordingly, an adapter device 183 is provided between the interface 184 and the SPE-based connector 181, which physically adapts the interface 184 to the SPE-based connector 182 and also converts the first communication protocol into the second communication protocol, and vice versa. An SPE-based line driver is expediently connected between the gateway 183 and the SPE-based connector 181.

FIG. 2c shows a module 200 similar to module 180, which has an SPE-based connector 201 which can be electrically and mechanically coupled to the SPE-based connector 22 of the bus system 20, for example. The SPE-based connector 211 may be electrically connected to an SPE-based line driver 202. Furthermore, the module 200 has an interface 204 to which a control device 222 can be connected via a field bus 210. The interface 204 is thus designed as a fieldbus-based interface. An example of a well-known field bus is the Profibus. Since the control device 222 can use Profibus as the communication protocol, an adapter device 203 is also implemented between the interface 204 and the SPE-based connector 211, which converts the fieldbus-based communication protocol into the first communication protocol and vice versa, and furthermore can effect a physical adaptation of the fieldbus based interface 204 to the SPE-based connector 201.

It should be noted at this point that all the modules explained are characterized in that they have a uniform connection point; namely, they each have one SPE-based connector for electrical and mechanical coupling to one of the SPE-based connectors 22-27 of the bus system 20. In addition, each of the explained modules functions so that communication is possible via the bus system 20 according to a predetermined, preferably Ethernet-based first communication protocol, regardless of the communication protocol used by the connected field devices or the specific control devices connected in each case.

Figure 3:
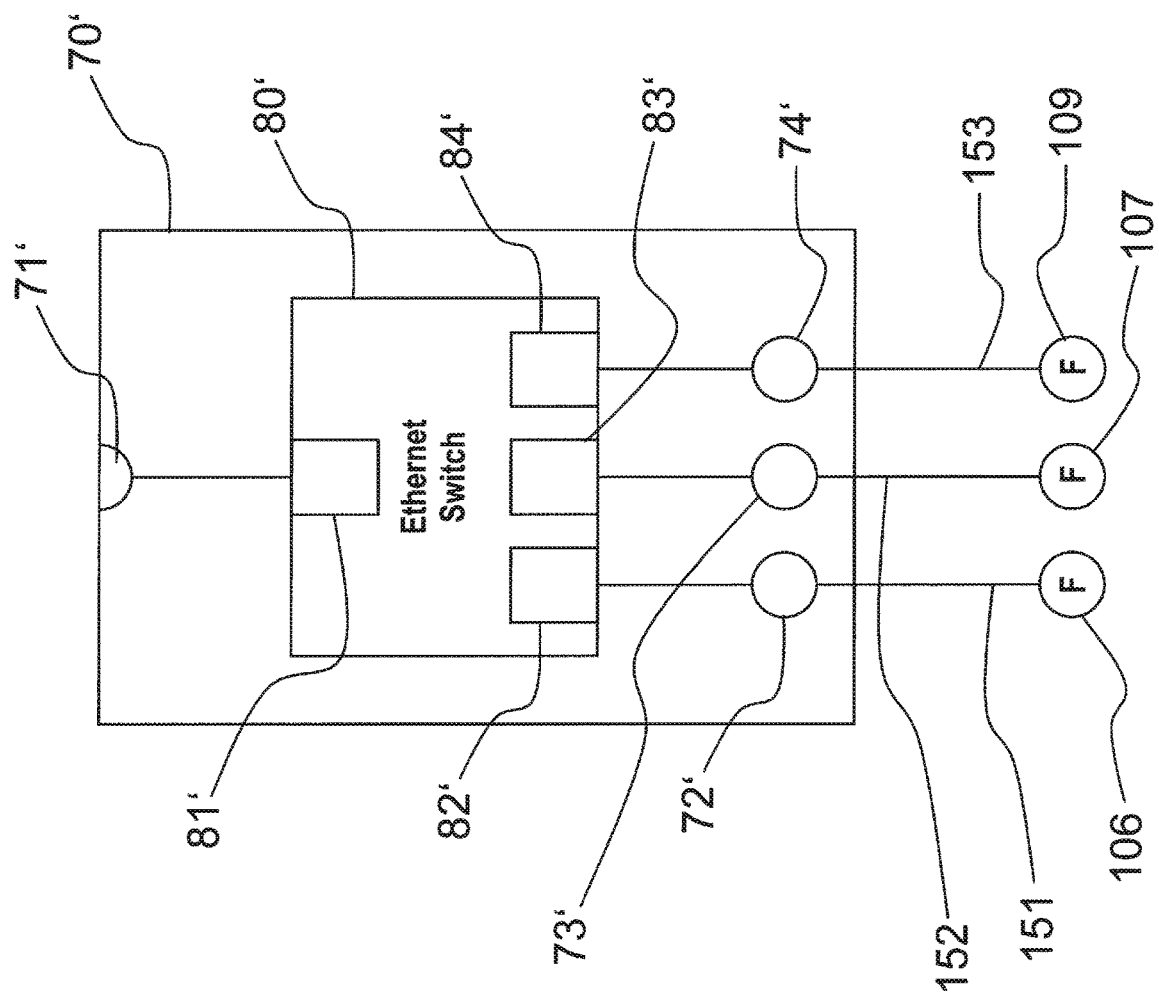
FIG. 3 is a multi-channel IO connection module.

FIG. 3 shows an IO connection module 70' which is slightly different from the connection module 70 and which, in contrast to the connection module 70, has, for example, three interfaces 72' to 74', each of which is designed as an SPE-based interface. In other words, the connection module 70' differs from the connection module 70 only with regard to the SPE-based interface identified as 74'. Again, a field device, in particular an SPE-based sensor or an SPE-based actuator, can be connected to each of the SPE-based interfaces.

In the following, some exemplary embodiments are explained which enable the field devices which can be connected to the various connection modules to be supplied with energy.

Figure 4:
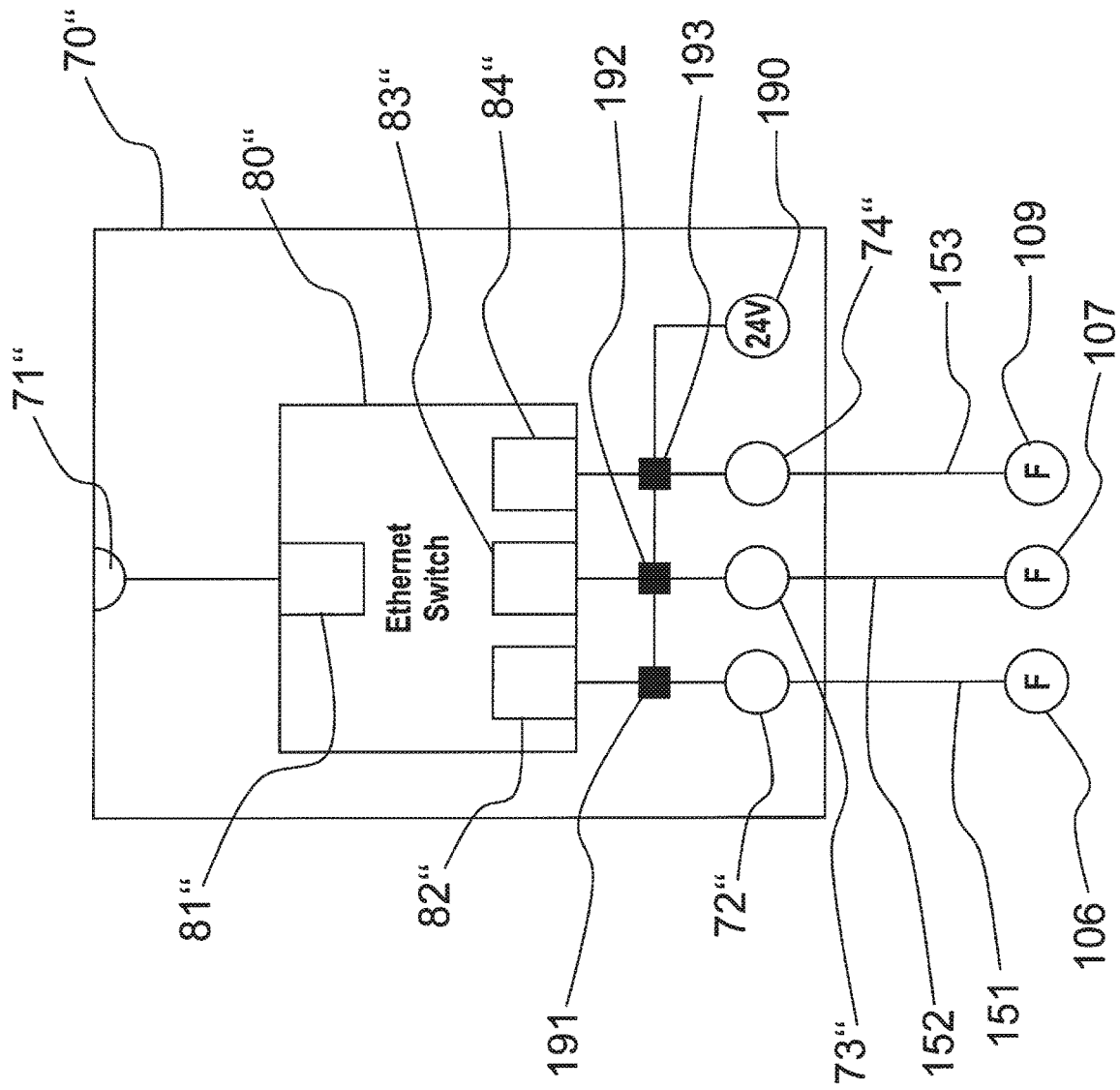
FIG. 4 is the multi-channel IO connection module shown in FIG. 3, with an internal energy supply device.

It can be contemplated that each module 30 to 70 and 90 which can be connected to the SPE-based bus system 20 has its own internal energy supply device. This approach is illustrated by way of example in FIG. 4 using an IO connection module 70". The module 70" differs from the connection module 70' shown in FIG. 3 in that an energy supply device 190 is integrated in the module 70", can provide a direct voltage of 24 V, for example. The direct voltage provided by the energy supply device 190 can be fed to each of the SPE-based interfaces 72", 73" and 74" via corresponding coupling devices 191, 192 and 193. In this way, the field devices which can be connected to these interfaces can be supplied with voltage.

Figure 5:
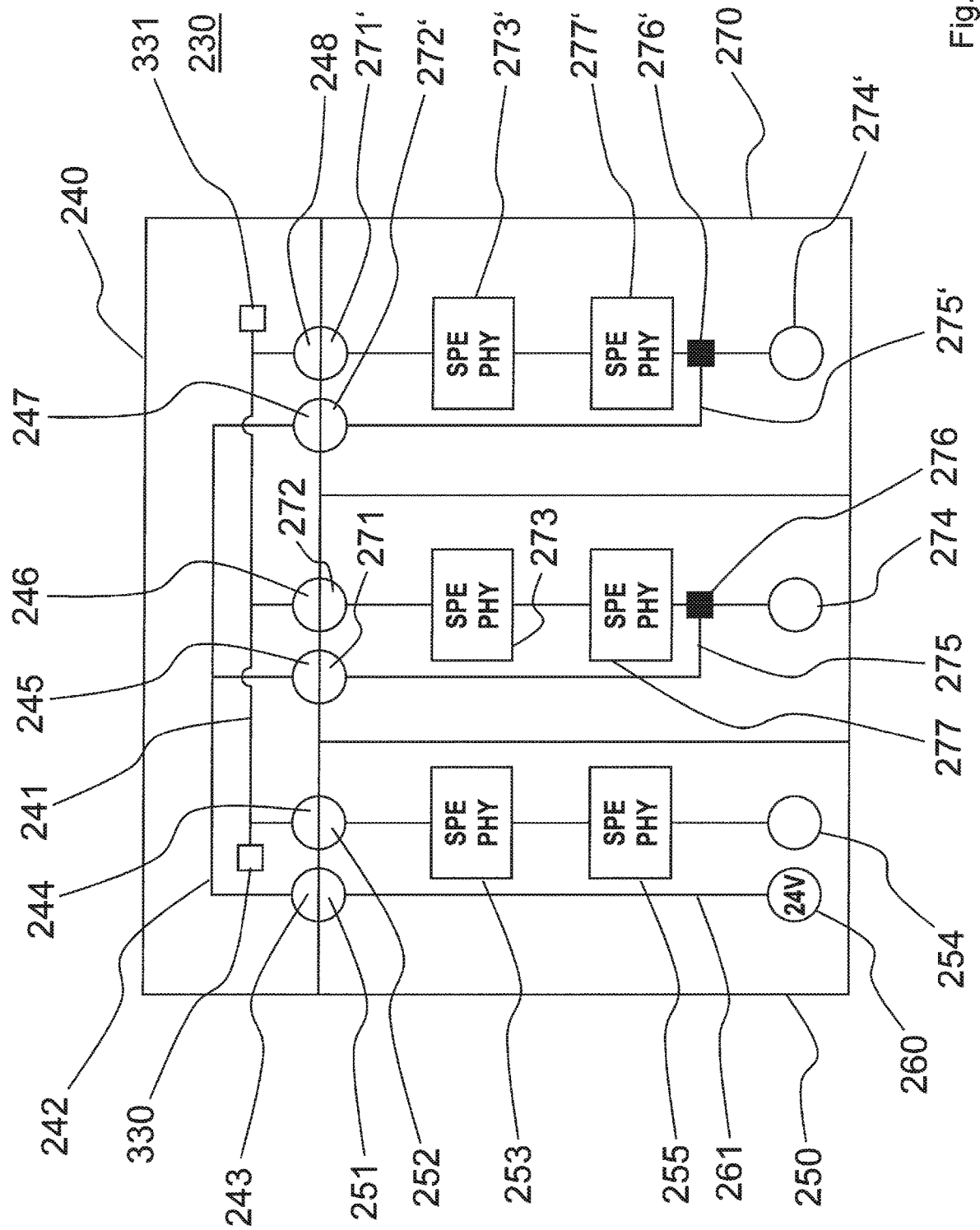
FIG. 5 is a further exemplary modular interface system according to the invention, wherein an internal energy supply device is implemented in the first module.

Another exemplary modular interface system 230 with an alternative voltage supply is shown in FIG. 5.

The voltage can be supplied centrally, for example, via a module 250 designed as a head station. The exemplary modular interface system 230 has an exemplary modular SPE-based bus system 240 which contains an SPE-based twin-core line 241 for data transmission and a power supply line 242. The SPE-based twin-core line 241 is terminated at both ends with a terminating resistor 330 or 331, respectively. Furthermore, the SPE-based bus system 42 has, for example, three SPE-based connectors 244, 246 and 248, which are electrically connected to the SPE-based twin-core line 241. Furthermore, the SPE-based bus system has, for example, three energy supply interfaces 243, 245 and 247, which are electrically connected to the energy supply line 242. The exemplary modular interface system 230 is thus designed to connect up to three modules, the SPE-based bus system 240 having one SPE-based connector 244, 26 or 248 and one power supply interface 243, 245 or 247, respectively, for each connectable module. Of course, the interface system 230 can also be designed to accommodate more than three modules.

The module 250, which is designed as a head station, for example, corresponds essentially to the module 30. In other words: The module 250 has an SPE-based connector 252 which can be electrically and mechanically coupled to the SPE-based connector 244 of the bus system 240, for example. Furthermore, the module 250 has, for example, an SPE-based interface 254 to which, for example, the control device 100 shown in FIG. 1 can be connected. Between the SPE-based interface 254 and the SPE-based connector 252, two SPE-based line drivers 253 and 255 wired opposite each other are preferably connected into an SPE-based twin-core line. The two SPE-based line drivers 253 and 255 ensure that the SPE-based bus system 240 and an electronic and/or electrical device which can be connected externally to the SPE-based interface 254 are decoupled. Furthermore, an energy supply device 260 is implemented in the module 250, which can provide a DC voltage of 24 V, for example. The energy supply source 260 is connected via an electrical line 261 to an energy supply interface 251, which can be electrically and mechanically coupled to the energy supply connection 243 of the bus system 240.

An IO connection module 270, which can be similar to the connection module 60 shown in FIG. 1, can be coupled to the SPE-based bus system 240. Accordingly, the module 270 has an SPE-based connector 272, which can be electrically and mechanically coupled, for example, to the SPE-based connector 246 of the bus system 240. Furthermore, the connection module 270 has a preferably SPE-based interface 274 to which an SPE-based field device, in particular an SPE-based sensor or an SPE-based actuator, can be connected. Furthermore, between the SPE-based connector 272 and the SPE-based interface 274, two SPE-based line drivers 273 and 277 wired opposite each other can be connected into an SPE-based twin-core line. The two SPE-based line drivers 273 and 277 ensure that the SPE-based bus system 240 and an electronic and/or electrical device that can be externally connected to the SPE-based interface 274 are decoupled. In addition, the connection module 270 has an energy supply connection 271, which can be electrically and mechanically coupled to the energy supply connection 245 of the SPE-based bus system 240. The energy supply connection 271 is electrically connected via an electrical line to a coupling device 276, which couples the energy provided by the energy supply device 260 into an SPE-based twin-core line which connects the SPE-based connector 272 to the SPE-based interface 274. The coupling device 276 is preferably arranged between the SPE-based interface 274 and the SPE-based line driver 277. In this way, the energy supply device 260 centrally integrated in the module 250 can supply energy to an SPE-based field device connected to the SPE-based interface 274.

A further module 270' can be connected to the SPE bus system 240 in the manner described above. The module 270' can be designed identically to the IO connection module 270, such that further explanations of the module 270' can be omitted.

Figure 6:
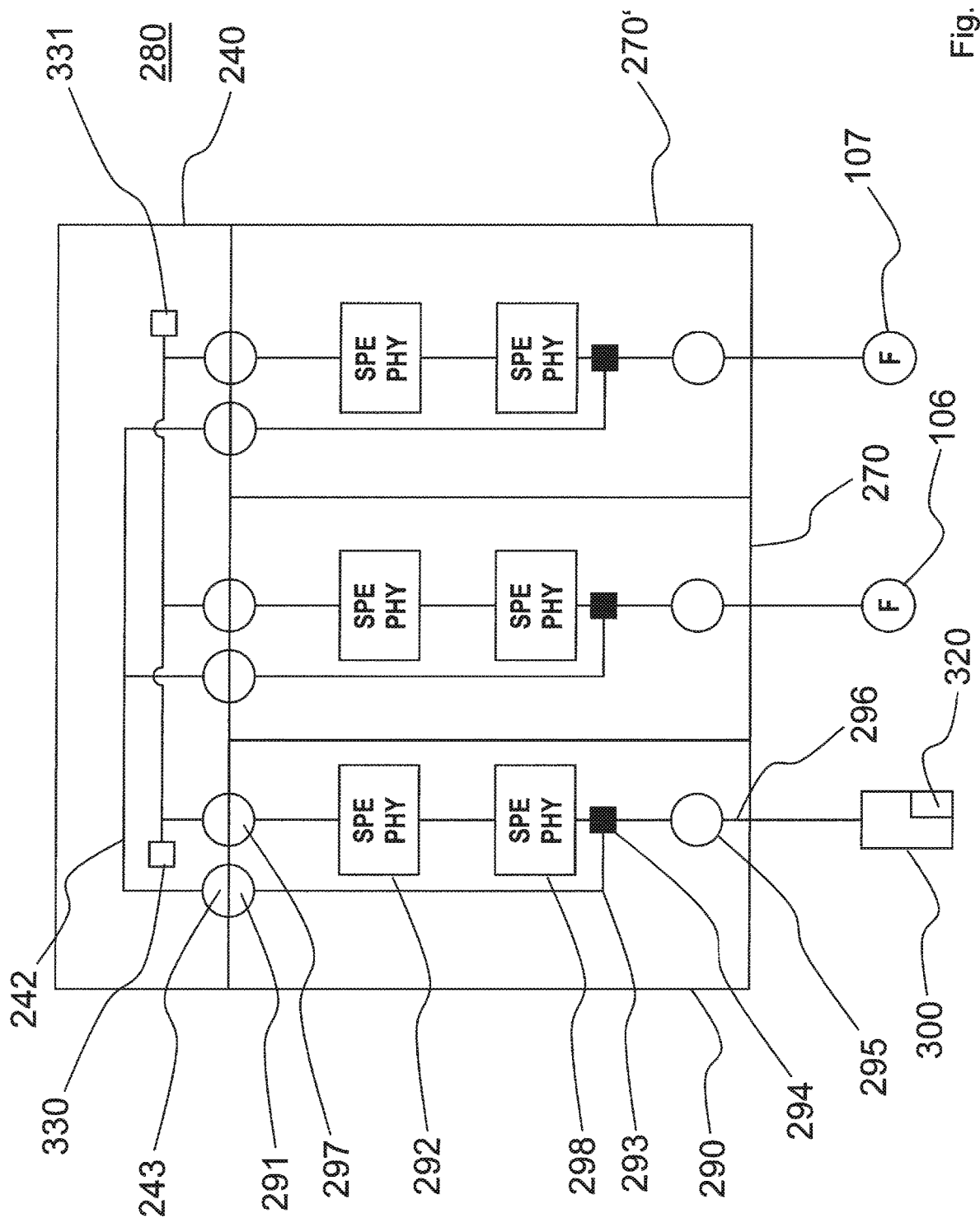
FIG. 6 is a further exemplary modular interface system which is supplied with energy via PoDL (Power over Data Line) technology.

FIG. 6 shows a further exemplary modular interface system 280, having an alternative voltage supply based on PoDL (Power over Data Line) technology. The exemplary modular interface system 280 can use the SPE-based bus system 240 shown in FIG. 5, to which the two modules 270 and 270' can be connected in addition to a module 290 functioning as a head station—as can be seen in FIG. 6. The module 290 has an SPE-based connector 292 for electrical and mechanical coupling to the SPE-based connector 244 and to, for example, an SPE-based interface 295, which can be connected via an SPE-based twin-core line 296. Between the SPE-based connector 297 and the SPE-based interface 295, two SPE-based line drivers 292 and 298 wired opposite each other are preferably connected into the SPE-based twin-core line 296. The two SPE-based line drivers 292 and 298 ensure that the SPE-based bus system 240 and an electronic and/or electrical device which can be connected externally to the SPE-based interface 295 are decoupled. Furthermore, the module 290 has a power supply connection 291, which can be connected electrically and mechanically to the power supply connection 243. The energy supply connection 291 is connected via an electrical line 293 to a decoupling device 294, which is expediently connected between the SPE-based line driver 298 and the SPE-based interface 295 into the SPE-based twin-core line 296. The decoupling device 294 has the task of feeding energy transmitted via the SPE-based twin-core line 296 into the line 293. Of course, the interface system 280 can also be designed to receive more than three modules.

The modular interface systems according to FIG. 5 and according to FIG. 6 essentially differ in that an energy supply device is not an integral part of the module 290, but rather forms an external energy supply source 320, which supplies energy via an SPE-based twin-core line 310 which is connected to the SPE-based interface 295 of the module 290. The energy supply source can be arranged in an SPE-based control device 300 which can be connected to the interface 295 via the SPE-based twin-core line 310. The energy supply device 320 can be a 24 V direct voltage source, for example. In this way, sensors and actuators which can be connected to the modules 270 and 270' can be supplied with energy by means of the external energy supply device 320 using PoDL technology. For example, the SPE-based sensor 106 shown in FIG. 1 can be connected to the module 270 and the SPE-based actuator 107 shown in FIG. 1 can be connected to the module 270'.

It goes without saying that the interface system 20 shown in FIG. 1 can be modified in a manner corresponding to the interface system 230 or the interface system 280 in order to be able to supply the connectable field devices 101 to 108 with energy.

It should also be noted that the IO connection modules shown by way of example in FIGS. 1 to 6 can be addressed in a suitable manner so that, for example, the control device 100 shown in FIG. 1 can specifically communicate with the field devices 101-107 which are connected to the modules 40, 50, 60, and 70. For example, an addressing approach can be implemented which enables the connected field devices to be addressed using the round robin method. The exemplary aspects of the invention are summarized again below in connection with the figures. FIGS. 1, 5 and 6 each show an exemplary modular interface system 10, 230 or 280 for connecting at least one control device 100, 300 and field devices 101-108, in particular actuators and/or sensors, which advantageously have the following features:

a modular SPE-based bus system 20, 240 with an SPE-based twin-core line 21, 241 and a plurality of first SPE-based connectors 22-27, 244, 246, 248, which are electrically connected to the SPE-based twin-core line 21 and/or 241, a first module 30, 180, 200, 250, 290, which has a second SPE-based connector 31, 252, 292 and a first interface 32, 254, 295, wherein the second SPE-based connector 31, 252, 292 is designed for electrical and mechanical coupling with one of the plurality of first SPE-based connectors 22, 244 of the SPE-based bus system 20, 240, and the first interface 32, 254, 295 is designed for electrically connecting a control device 100, 300, wherein the first module 30, 250, 290 is designed to enable the communication of a control device 100, 300 which can be connected to the first interface 32, 254, 295 via the SPE-based bus system 20, 240, according to a first communication protocol, and also at least one second module 40, 270 which has a third SPE-based connector 41, 272, which is designed for electrical and mechanical coupling to another of the plurality of first SPE-based connectors 23, 246 of the SPE-based bus system 20, 240, and which has at least one second interface 45, 46 or 274 which is designed to connect a field device 101, 102, wherein the second module 40, 270 is designed to allow data transmission to a field device 101, 102 which can be connected to the at least one second interface 45, 46 or 274 via the SPE-based bus system 20, 240, according to the first communication protocol, and/or a third module 70, which has a fourth SPE-based connector 71 which is designed for electrical and mechanical coupling with one of the plurality of first SPE-based connectors 26 of the SPE-based bus system 20, at least one third and fourth interface 72-74, which are each designed for the connection of a field device 106-108, and which has a switch 80, in particular an Ethernet switch, which has a first port 81 assigned to the fourth SPE-based connector 71, a second port 82 assigned to the third interface 72, and a third port 83 assigned to the fourth interface 73, wherein the second port 82 and the third interface 72 are based on SPE technology or on a first Ethernet technology that is not SPE technology, wherein the third port 83 and the fourth interface 73 are based on SPE technology or on a second Ethernet technology that is not SPE technology, wherein the first and second Ethernet technology are the same or different, wherein the third module 70 is designed to enable the communication of a field device 106 which can be connected to the third interface 72, and the communication of a field device 107 which can be connected to the fourth interface 73, via the SPE-based bus system (20), according to the first communication protocol. It should be noted that the non-SPE-based Ethernet technology can be the 4-wire or 8-wire Ethernet technology known per se. As can be seen by way of example in FIGS. 2b and 2c, the first interface 184, 204 of the first module 180 and/or 200 can be designed for connecting a control device 221 and/or 222, the control device 221 or 222 using a second communication protocol, and the first module 180 and/or 200 has a gateway 183 and/or 203 connected between the first interface 184 and/or 204 and the second SPE-based connector 181 and/or 201, which is designed to convert the first communication protocol into the second communication protocol, and vice versa.

The second communication protocol can be a fieldbus-based communication protocol such as MODBUS/TCP, while the first communication protocol can be PROFINET, for example. As can be seen by way of example in FIG. 1, the first interface 32 of the first module 30 can be designed as an SPE-based interface for connecting an SPE-based control device 100 which can use the first communication protocol. Two SPE-based line drivers 33 and 35 wired opposite each other are then preferably connected between the first interface 32 and the SPE-based connector 31.

As can be seen by way of example in FIG. 2a, the control device 220 which can be connected to the first interface 161 of the first module 160 can use the first communication protocol, wherein the first module 160 has at least one fifth interface 162, 164, which is designed to connect a field device that can use the first communication protocol, and a switch 170 which has a first SPE-based port 171 assigned to the second SPE-based connector 161, a second port 173 assigned to the first interface 163, and a third port 172, 174 assigned to the at least one fifth interface 162, 164, wherein the second port 173 and the first interface 163 are based on SPE technology or a third Ethernet technology that is not SPE technology, wherein the third port 172, 174 and the at least one fifth interface 162, 164 are based on SPE technology or a fourth Ethernet technology that is not SPE technology, and the third and fourth Ethernet technologies are the same or different. The third and fourth Ethernet technology are expediently 4-wire or 8-wire Ethernet technology.

As can also be seen by way of example in FIG. 2a, the modular interface system can be characterized in that the control device which can be connected to the first interface 161 of the first module 160 uses a second communication protocol, the first module 160 has at least one fifth interface 162, 164, which is used to connect a field device which uses the second communication protocol, and has a switch 170, which has a first SPE-based port 171 assigned to the second SPE-based connector 161, a second port 173 assigned to the first interface 163 and a third port 172, 174 assigned to the at least one fifth interface 162, 164, wherein the second port 173 and the first interface 163 are based on SPE technology or a third Ethernet technology that is not SPE technology, wherein the third port 172, 174 and the at least one fifth interface 162, 164 are based on SPE technology or a fourth Ethernet technology that is not SPE technology, wherein the third and fourth Ethernet technology are the same or different, and in that between the first port 171 of the switch 170 and the second SPE-based connector 161, a gateway 165 is connected, which is designed to convert the first communication protocol into the second communication protocol, and vice versa.

As can be seen by way of example in FIG. 1, the at least one second interface 55, 56 of the at least one second module 50 can be used as an IO-Link interface for connecting an IO-Link field device 103, 104 which uses the IO-Link communication protocol, wherein a gateway 53 is connected between the at least one second interface 55, 56 and the third SPE-based connector 51 of the at least one second module 50, which is designed to convert the first communication protocol into the IO-Link communication protocol and vice versa. As can also be seen by way of example in FIG. 1, the at least one second interface 45, 46 of the at least one second module 40 can be designed as a digital interface for connecting a field device 101, wherein the field device 101 has a digital output or a digital input and uses a third communication protocol, wherein a gateway 43 is connected between the at least one second interface 45, 46 and the third SPE-based connector 41 of the at least one second module (40), which is designed to convert the first communication protocol into the third communication protocol, and vice versa.

As can be seen by way of example in FIG. 1, the at least one second interface 45, 46 of the at least one second module 40 can be designed as an analog interface for connecting a field device 101, 102, wherein the field device has an analog output or an analog input and uses a third communication protocol, wherein between the at least one second interface 45, 46 and the third SPE-based connector 41 of the at least one second module 40, a gateway 43 is connected, which is designed to convert the first communication protocol into the third communication protocol, and vice versa.

As FIG. 1 further shows by way of example, the modular interface system 10 can have a fourth module 90 with the following features:

a fifth SPE-based connector 91, which is designed for electrical and mechanical coupling to one of the plurality of first SPE-based connectors 27 of the SPE-based bus system 20, and an SPE-based interface 93 which is designed to connect an SPE-based field device or to connect to a further modular interface system 110 which has an SPE-based bus system 120, wherein the fourth module 90 is designed to enable the communication of a connected SPE-based field device or the further modular interface system 110, according to the first communication protocol, via the SPE-based bus system 20.

The modular SPE-based bus system 20 can be designed as a fifth module for electrical and mechanical coupling with the first and/or second and/or third and/or fourth module 30-70, 90.

Alternatively, the modular SPE-based bus system 20 can be composed of a plurality of individual modular bus system segments, wherein each bus system segment has at least one of the first connectors and is designed for electrical and mechanical coupling to the first, second, third or fourth module.

The SPE-based bus system 20 or 240 can be designed for mounting on a mounting rail.

As can be seen by way of example in FIG. 5, an energy supply device 260 can be implemented at least in the first module 250, wherein the SPE-based bus system 240, the first module 250 and also the second module 270 and/or the third module 270' and/or, if present, a fourth module can each be designed to supply the voltage supplied by the energy supply device 260 to the first module 250 and also to the second and/or third and/or fourth module 270, 270' to supply energy to the field devices which can be connected to the second and/or third and/or fourth module.

As shown by way of example in FIG. 6, the SPE-based bus system 240, the first module 290, and also the second module 270 and/or the third module 270' and/or, if present, the fourth module can each be designed to supply the energy, which is supplied by an external energy supply device 320 via an SPE-based twin-core line 310 to the first interface 295 of the first module 250, to the second and/or third and/or fourth module 270, 270' to supply energy to the SPE-based field devices 106, 107 which can be connected to the second and/or third and/or fourth module, according to PoDL technology. Depending on the implementation, the energy supply device 320 can also be used to supply energy to the first and/or second and/or third and/or fourth, and optionally any further, modules.

A compact arrangement of the interface system 10, 110, 230 or 280 results from the fact that the first and also the second and/or third and/or fourth module 30-70, 90 can be coupled together side by side and adjacent on the modular SPE-based bus system 20, 120 or 240.

The invention claimed is:

1. A modular interface system for connecting at least one control device and field devices, in particular actuators and/or sensors, comprising:
a modular Single Pair Ethernet-based (SPE-based bus system which has an SPE-based twin-core line and a plurality of first SPE-based connectors which are electrically connected to the SPE-based twin-core line,
a first module which has a second SPE-based connector and a first interface, wherein the second SPE-based connector is designed for electrical and mechanical coupling with one of the plurality of first SPE-based connectors of the SPE-based bus system, and the first interface is designed for the electrical connection of a control device, wherein the first module is designed to enable the communication of a control device which can be connected to the first interface, via the SPE-based bus system, according to a first communication protocol, and also
at least one second module which has a third SPE-based connector which is designed for electrical and mechanical coupling to another of the plurality of first SPE-based connectors of the SPE-based bus system, and with at least one second interface designed to connect a field device, wherein the second module is designed to enable the data transmission of a field device which can be connected to the at least one second interface via the SPE-based bus system, according to the first communication protocol, and/or a third module, which has a fourth SPE-based connector which is designed for electrical and mechanical coupling with one of the plurality of first SPE-based connectors of the SPE-based bus system, at least one third and fourth interface which each are designed for connecting a field device, and which has a switch, which has a first port assigned to the fourth SPE-based connector, a second port assigned to the third interface, and a third port assigned to the fourth interface, wherein the second port and the third interface are based on SPE technology or on a first Ethernet technology that is not SPE technology, wherein the third port and the fourth interface are based on SPE technology or on a second Ethernet technology that is not SPE technology, wherein the first and second Ethernet technology are the same or different, wherein the third module is designed to enable the communication of a field device which can be connected to the third interface, and the communication of a field device which can be connected to the fourth interface, via the SPE-based bus system, according to the first communication protocol.

2. The modular interface system according to claim 1, characterized in that the first interface of the first module is designed for connecting a control device, wherein the control device uses a second communication protocol, and in that the first module has a gateway connected between the first interface and the second SPE-based connector, which is designed to convert the first communication protocol into the second communication protocol, and vice versa.

3. The modular interface system according to claim 2, characterized in that the second communication protocol is a fieldbus-based communication protocol.

4. The modular interface system according to claim 1, characterized in that the first interface of the first module is designed as an SPE-based interface for connecting an SPE-based control device which uses the first communication protocol.

5. The modular interface system according to claim 1, characterized in that the control device which can be connected to the first interface of the first module uses the first communication protocol, the first module has at least one fifth interface which is designed to connect a field device that uses the first communication protocol, and has a switch which has a first SPE-based port assigned to the second SPE-based connector, a second port assigned to the first interface, and a third port assigned to at least one fifth interface, wherein the second port and the first interface are based on SPE technology or a third Ethernet technology that is not SPE technology, wherein the third port and the at least one fifth interface are based on SPE technology or a fourth Ethernet technology that is not SPE technology, and the third and fourth Ethernet technologies are the same or different.

6. The modular interface system according to claim 1, characterized in that the control device which can be connected to the first interface of the first module uses a second communication protocol, the first module has at least one fifth interface which is designed to connect a field device that uses the second communication protocol, and has a switch which has a first SPE-based port assigned to the second SPE-based connector, a second port assigned the first interface, and a third port assigned to at least one fifth interface, wherein the second port and the first interface are based on SPE technology or a third Ethernet technology which is not SPE technology, wherein the third port and the at least one fifth interface are based on SPE technology or a fourth Ethernet technology that is not SPE technology, wherein the third and fourth Ethernet technology are the same or different, and in that between the first port of the switch and the second SPE-based connector, a gateway can be connected which is designed to convert the first communication protocol into the second communication protocol, and vice versa.

7. The modular interface system according to claim 1, characterized in that the at least one second interface of the at least one second module is designed as an IO-Link interface for connecting an IO-Link field device which uses the IO-Link protocol, wherein a gateway is connected between the at least one second interface and the third SPE-based connector of the at least one second module, which is designed to convert the first communication protocol into the IO-Link protocol, and vice versa.

8. The modular interface system according to claim 1, characterized in that the at least one second interface of the at least one second module is designed as a digital interface for connecting a field device, wherein the field device has a digital output or a digital input and uses a third communication protocol, wherein a gateway is connected between the at least one second interface and the third SPE-based connector of the at least one second module, which is designed to convert the first communication protocol into the third communication protocol, and vice versa.

9. The modular interface system according to claim 1, characterized in that the at least one second interface of the at least one second module is designed as an analog interface for connecting a field device, wherein the field device has an analog output or an analog input and uses a third communication protocol, wherein a gateway is connected between the at least one second interface and the third SPE-based connector of the at least one second module, which is used to convert the first communication protocol into the third communication protocol, and vice versa.

10. The modular interface system according to claim 1, characterized by a fourth module having:
a fifth SPE-based connector which is designed for electrical and mechanical coupling to one of the plurality of first SPE-based connectors of the SPE-based bus system, and an SPE-based interface which is designed to connect an SPE-based field device or to connect to a further modular interface system which has an SPE-based bus system, wherein the fourth module is designed to enable communication of a connected SPE-based field device or the further modular interface system, according to the first communication protocol, via the SPE-based bus system.

11. The modular interface system according to claim 1, characterized in that the modular SPE-based bus system is designed as a fifth module for electrical and mechanical coupling with the first and/or second and/or third and/or fourth module.

12. The modular interface system according to claim 1, characterized in that the modular SPE-based bus system can be assembled from a plurality of individual modular bus system segments, wherein each bus system segment has at least one of the first connectors and is designed for electrical and mechanical coupling with the first, second, third or fourth module.

13. The modular interface system according to claim 1, characterized in that the SPE-based bus system is designed for mounting on a support rail.

14. The modular interface system according to claim 1, characterized in that a power supply device is implemented at least in the first module, in that the SPE-based bus system, the first module, and also the second module and/or the third module and/or the fourth module are each designed to provide the voltage, supplied by the energy supply device to the first module and also to the second and/or third and/or fourth module, to supply energy to the first and/or second and/or third and/or fourth module and/or to the field devices which can be connected to the second and/or third and/or fourth module.

15. The modular interface system according to claim 1, characterized in that the SPE-based bus system, the first module, and also the second module and/or the third module and/or the fourth module are each designed to supply the energy, provided by an external energy supply device via an SPE-based twin-core line to the first interface of the first module, to the second and/or third and/or fourth module to supply energy to the SPE-based field devices which can be connected to the second and/or third and/or fourth module, according to PoDL technology.

16. The modular interface system according to claim 1, characterized in that the first and also the second and/or third and/or fourth module can be coupled adjacent to each other and side-by-side on the modular SPE-based bus system.

* * * * *